United States Patent [19]

Kietzer

[11] Patent Number: 4,967,163
[45] Date of Patent: Oct. 30, 1990

[54] COMBINED LIMITING/AGC IF SYSTEM

[75] Inventor: James E. Kietzer, Chicago, Ill.

[73] Assignee: The United States of America as represented by the Secretary of the Navy, Washington, D.C.

[21] Appl. No.: 398,277

[22] Filed: Sep. 17, 1973

[51] Int. Cl.$^5$ ............................................. H03F 1/36
[52] U.S. Cl. ....................................... 330/86; 330/85; 330/189
[58] Field of Search ....................... 330/27, 28, 75, 85, 330/86; 325/319, 397, 402; 343/5 AGC, 7 A; 178/7.3 DC; 340/15.5 GC

[56] References Cited
U.S. PATENT DOCUMENTS
3,673,498  5/1970  Harford ............................... 329/319

Primary Examiner—Nelson Moskowitz
Attorney, Agent, or Firm—Kenneth E. Walden

[57] ABSTRACT

A gain control system for a receiver that combines some of the features of both limiting and AGC. The AGC loop of the present invention has a relatively long time constant which reduces the gain so that the desired signal is only 10 to 15 db into limiting. This degree of limiting provides instantaneous control of small changes in signal level, but prevents the receiver from instantaneously opening to full gain in the case of loss of signal. This prevents erroneous data from being received during a time interval in which it is expected that the original signal will return.

1 Claim, 2 Drawing Sheets

COMBINED LIMITING/AGC IF SYSTEM

BACKGROUND OF THE INVENTION

The present invention pertains generally to voltage magnitude control systems and more specifically to feedback systems with signal level or other control means.

Prior systems have been able to control or regulate to some desired level the normally fluctuating input signal received by a radar or radio receiver either by limiting or by automatic gain control (AGC) in the IF amplifier but not by the combination of the two. An AGC system includes a feedback control loop which has a time constant depending upon the design of the loop. This gives a finite reaction time and thus it cannot respond instantaneously to a change in input signal level. Additionally, AGC systems have been shown to be influenced in an undesirable manner by interfering signals.

Limiting systems, on the other hand, respond to input level changes instantaneously and are not influenced by interfering signals in the same manner as AGC. The limiter, however, has another characteristic that can be a disadvantage in some applications. In the case of a short term signal dropout or severe level reduction, the limiter instantaneously supplies full gain and allows other signals of lower level to be received. These undesirable signals may add noise or errors to correct data already received and in some cases may capture other receiver circuits so as to prevent reception of the desired signal when it returns to full level.

SUMMARY OF THE INVENTION

These disadvantages and limitations are overcome by the present invention which combines the AGC and limiting systems to achieve some of the advantages of both. The time constant of the AGC section of the invention is made longer than normal AGC systems while the regulated output signal level of the AGC section is higher than the limiting level of the limiter. In operation, the AGC section holds the output at a constant level and follows slow changes in the input signal while rapid changes are accomodated by the limiter which produces a constant output.

It is therefore the object of the present invention to provide a device for regulating fluctuating input signals.

It is also the object of the present invention to provide a device of regulating instantaneous changes in signal level.

Another object of the present invention is to provide a device for regulating slow changes in signal level.

Other objects, advantages and novel features of the invention will become apparent from the following detailed description of the invention when considered in conjunction with the accompanying drawings wherein:

DETAILED DESCRIPTION OF THE PREFERRED EMBODIMENT

Figure 1:
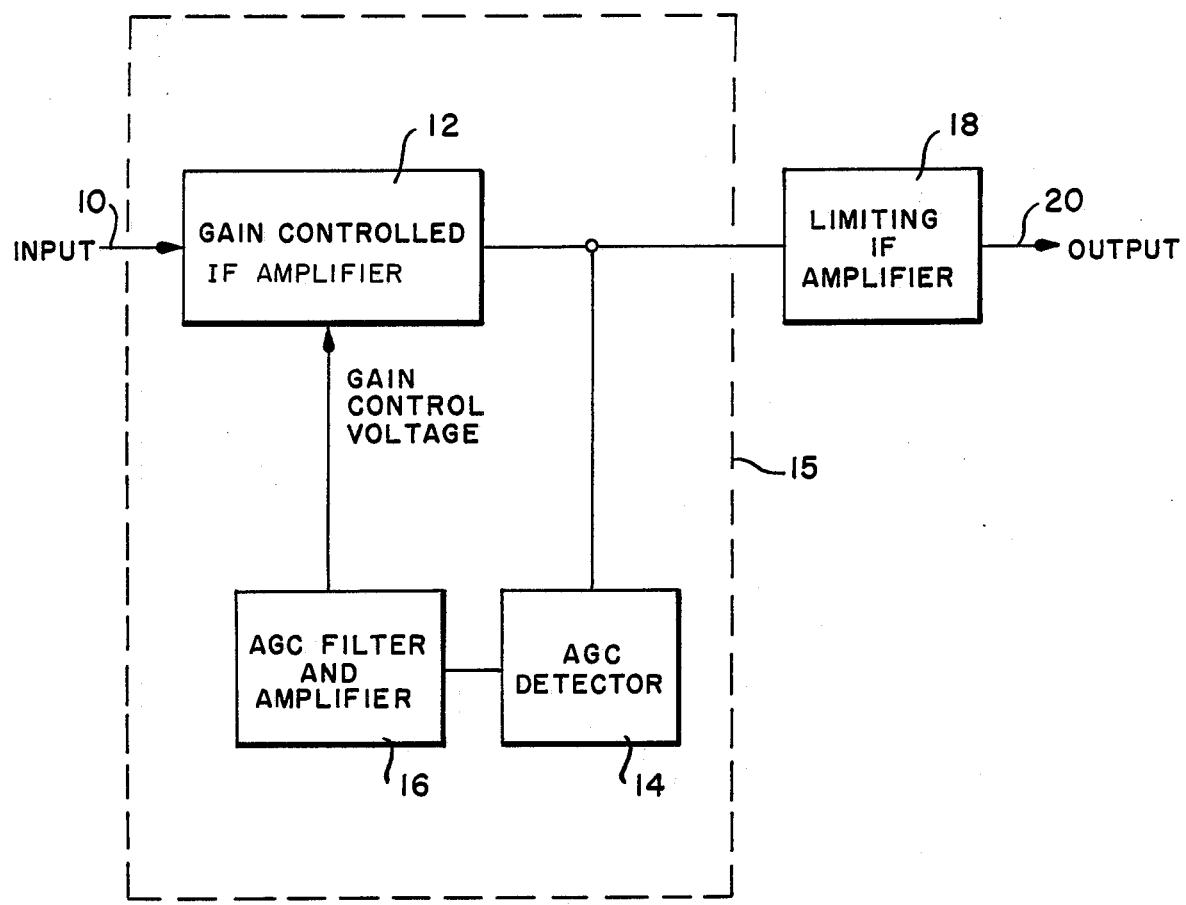
FIG. 1 shows the preferred embodiment.

FIG. 1 discloses the combined limiting-AGC system of the preferred embodiment as it is used in conjunction with the IF amplifier stage of a receiver. Input 10 is fed to the gain controlled IF amplifier 12 which produces an output which is fed both to an AGC detector 14 and a limiting IF amplifier 18. AGC detector 14 senses the signal magnitude of the output of the IF amplifier 12 and feeds it to the AGC filter and amplifier 16 which produces a gain control voltage signal. This signal constitutes an error signal for gain controlled IF amplifier 12 to control the signal magnitude at its output. The signal magnitude at the output of the gain controlled IF amplifier 12 is also controlled by a limiting IF amplifier 18 which produces a constant output for rapid changes. The AGC IF system has a time constant longer than normal AGC systems while its regulated output signal level is higher than the limiting level of the limiter.

In operation, the AGC section 15 holds its output at some constant level, and only follows slow changes in input signal due to its long time constant. If the input signal has rapid variations, these same variations will appear at the output and will be applied to the limiter 18. Since the limiter 18 acts instantaneously, the limiter 18 will accommodate the rapid changes and produce a constant output.

When a deep signal fade or dropout occurs the gain of the limiter 18 will increase to its full level but the gain of the AGC section 15 will remain approximately the same because of its long time constant. Thus, the overall gain increases only by the amount that the normal output of the AGC section exceeds the limiting level. This may typically be 10 to 20 db instead of the full dynamic range of the system which may be typically 70 or 80 db. Thus, noise and lower level signals are prevented from entering the system during the fade. However, in cases where the original signal disappears completely, the AGC section gain will gradually increase and allow reception of other signals.

The particular advantage claimed for this invention is that it can regulate the signal level instantaneously over any restricted portion of its overall dynamic range without increasing gain during deep fades or dropouts to a level that would allow excessive noise or interference to enter the system during these fades or dropouts. On the other hand, the AGC action, while slow, will allow the system to respond to other signals if the original one disppears permanently or for an extended period.

Figure 2:
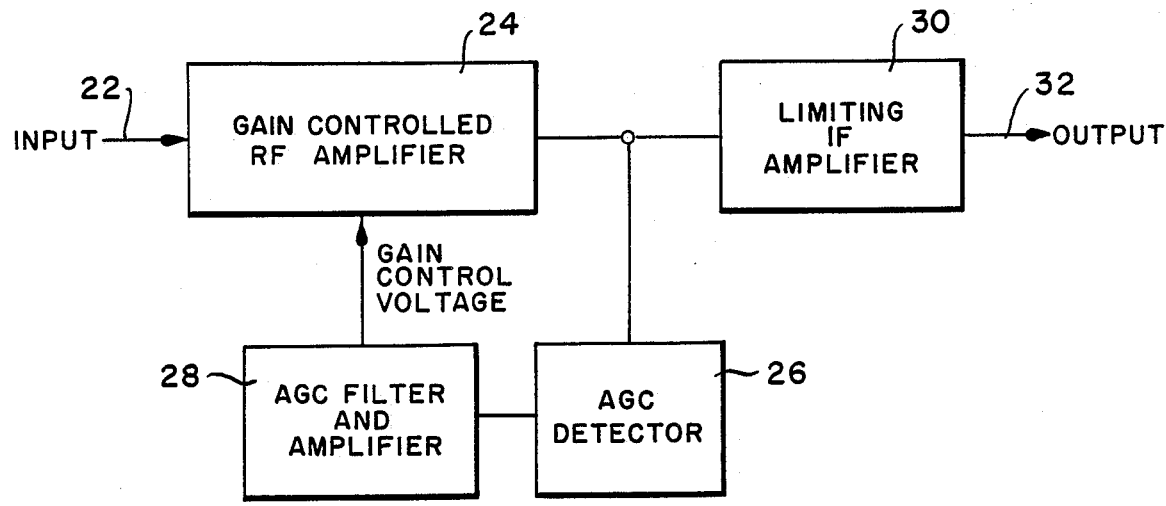
FIG. 2 shows an alternative embodiment.

FIG. 2 discloses the same combined limiting-AGC system used in conjunction with a gain controlled RF amplifier. This system works in the same manner as that disclosed in FIG. 1 except at RF frequencies.

Figure 3:
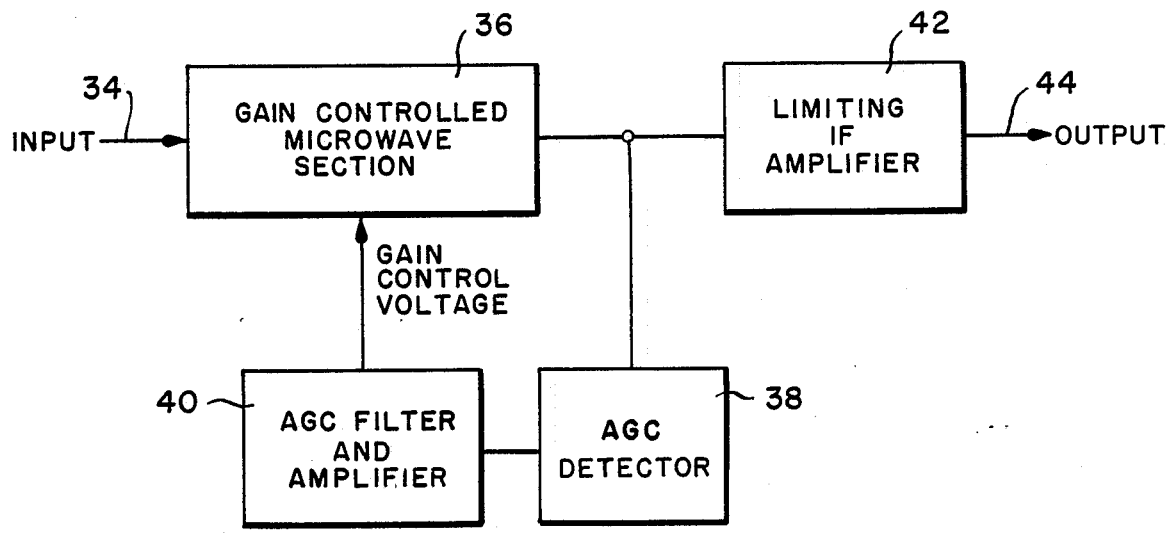
FIG. 3 shows an additional alternative embodiment.

FIG. 3 similarly discloses the same system used in the microwave section of a receiver and operates in the same manner at microwave frequencies.

Obviously many modifications and variations of the present invention are possible in light of the above teachings. It is therefore to be understood that within the scope of the appended claims the invention may be practiced otherwise than as specifically described.

What is claimed as new and desired to be secured by Letters Patent of the United States is:

1. A device of regulating fluctuating input electrical signals comprising:
   gain control means for amplifying said fluctuating input signal in accordance with a control voltage to produce a gain controlled output signal having a regulated output signal level;
   means for detecting said regulated output signal level and producing said control voltage in accordance with a difference in magnitude between said regulated output signal level and a predetermined level;
   means for limiting instantaneous changes in said regulated output signal level;
   whereby said input signal is regulated instantaneously its overall dynamic range without increasing gain to allow noise during signal fades but still responding to additional input signals if said input signal disappears permanently.

* * * * *